United States Patent
Li

(10) Patent No.: US 11,758,750 B2
(45) Date of Patent: Sep. 12, 2023

(54) BENDABLE BACKPLANE STRUCTURE AND OLED DISPLAY ASSEMBLY

(71) Applicant: WUHAN CHINA STAR OPTOELECTRONICS SEMICONDUCTOR DISPLAY TECHNOLOGY CO., LTD., Hubei (CN)

(72) Inventor: Yun Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 1309 days.

(21) Appl. No.: 16/309,266

(22) PCT Filed: Sep. 6, 2018

(86) PCT No.: PCT/CN2018/104284
§ 371 (c)(1),
(2) Date: Dec. 12, 2018

(87) PCT Pub. No.: WO2020/034276
PCT Pub. Date: Feb. 20, 2020

(65) Prior Publication Data
US 2021/0265586 A1    Aug. 26, 2021

(30) Foreign Application Priority Data

Aug. 13, 2018    (CN) .......................... 201810913265.9

(51) Int. Cl.
*H10K 50/80*     (2023.01)
*B32B 3/26*      (2006.01)
(Continued)

(52) U.S. Cl.
CPC ............. *H10K 50/80* (2023.02); *B32B 3/266* (2013.01); *B32B 3/28* (2013.01); *B32B 7/12* (2013.01);
(Continued)

(58) Field of Classification Search
CPC ................. H01L 51/52; H01L 51/0097; H01L 2251/5338; G09F 9/301; B32B 3/266;
(Continued)

(56) References Cited

U.S. PATENT DOCUMENTS 10,082,839 B1 *  9/2018  Turchin .................. G09F 9/301
2016/0189610 A1  6/2016  Xiao et al.
(Continued)

FOREIGN PATENT DOCUMENTS

CN       104464643 A    3/2015
CN       105427806 A    3/2016
(Continued)

*Primary Examiner* — Aaron J Gray

(57) ABSTRACT

A bendable backplane structure is provided. The bendable backplane structure includes a first flexible layer, and a metal layer which is disposed on the first flexible layer and includes a first metal section and a second metal section, wherein the first metal section includes a first extension, the second metal section includes a second extension, and the first extension is disposed corresponding to the second extension in a lamination direction from the first flexible layer toward the metal layer. The bendable backplane further also includes a second flexible layer which is disposed on the metal layer.

19 Claims, 2 Drawing Sheets

(51) Int. Cl.
    *B32B 3/28*           (2006.01)
    *B32B 7/12*           (2006.01)
    *B32B 15/04*          (2006.01)
    *G09F 9/30*           (2006.01)
    *H10K 77/10*          (2023.01)
    *H10K 102/00*        (2023.01)

(52) U.S. Cl.
    CPC .............. *B32B 15/04* (2013.01); *G09F 9/301* (2013.01); *H10K 77/111* (2023.02); *B32B 2457/206* (2013.01); *H10K 2102/311* (2023.02)

(58) Field of Classification Search
    CPC .. B32B 3/28; B32B 7/12; B32B 15/04; B32B 2457/206
    See application file for complete search history.

(56) References Cited

U.S. PATENT DOCUMENTS

| | | | |
|---|---|---|---|
| 2017/0193901 A1 | 7/2017 | Wang et al. | |
| 2018/0102496 A1 | 4/2018 | Kim | |
| 2018/0197933 A1* | 7/2018 | Son | H10K 59/131 |
| 2019/0005857 A1* | 1/2019 | Wakata | H10K 59/00 |

FOREIGN PATENT DOCUMENTS

| | | | | |
|---|---|---|---|---|
| CN | 106252378 A | | 12/2016 | |
| CN | 107256694 A | | 10/2017 | |
| CN | 107403590 A | | 11/2017 | |
| CN | 107507518 A | * | 12/2017 | ............. G09F 9/301 |
| CN | 107564417 A | * | 1/2018 | ................ G09F 9/30 |
| CN | 107564417 A | | 1/2018 | |

* cited by examiner

BENDABLE BACKPLANE STRUCTURE AND OLED DISPLAY ASSEMBLY

CROSS REFERENCE TO RELATED APPLICATIONS

This application is a U.S. National Phase application submitted under 35 U.S.C. § 371 of Patent Cooperation Treaty Application serial No. PCT/CN2018/104284, filed Sep. 6, 2018, which claims the priority of China Patent Application serial No. 201810913265.9, filed Aug. 13, 2018, the disclosures of which are incorporated herein by reference in their entirety.

BACKGROUND OF THE DISCLOSURE

1. Field of the Disclosure

The present disclosure relates to the field of display technology, and more particularly, to a bendable backplane structure and an OLED display assembly.

2. Description of the Related Art

A bendable OLED displaying layer with a bendable backplane can realize the supportability and the bendability of the display assembly. At present, the ordinary design realizes the bending by using a bending mechanism, wherein the bending can be realized in only one direction, either inwardly or outwardly.

Therefore, there exists deficiencies in the current technology and improvements are urgently needed.

SUMMARY

An object of the present disclosure is to provide a bendable backplane structure and an OLED display assembly which have the benefit of being bendable toward each of their front sides and back sides.

A bendable backplane structure, provided in an embodiment of the present disclosure, comprising:

a first flexible layer, including: a first area, a second area and a third area, which are connected in order; a metal layer, which is disposed on the first flexible layer, including: a first metal section and a second metal section, wherein the first metal section is connected to the first area, the second metal section is connected to the third area, the first metal section includes a first extension, the second metal section includes a second extension, the first extension is disposed corresponding to the second extension in a lamination direction from the first flexible layer toward the metal layer; a second flexible layer, which is disposed on the metal layer, including: a fourth area, a fifth area and a sixth area, which are connected in order, wherein the fourth area and the sixth area are connected to the first metal section and the second metal section respectively, the fourth area, the fifth area and the sixth area are disposed corresponding to the first area, the second area and the third area respectively; wherein the first metal section further includes a first main body which is disposed on the first area, the first extension extends from the first main body to the vicinity of one side of the second metal section, and a thickness of the first extension is less than a thickness of the first main body, and wherein the second metal section further includes a second main body which is disposed on the third area, the second extension extends from the second main body to the vicinity of one side of the first metal section, and a thickness of the second extension is less than a thickness of the second main body; wherein the first extension and the second extension overlap between the fifth area and the second area, and there is a first gap between the first extension and the second extension; and wherein the parts of the first metal section and the second metal section, which are located between the second area and the fifth area, are doped with a memory metal.

In the bendable backplane structure of the present disclosure, the second area of the first flexible layer and the fifth area of the second flexible layer each have a plurality of through holes.

In the bendable backplane structure of the present disclosure, the second area of the first flexible layer and the fifth area of the second flexible layer each have a wrinkled structure.

In the bendable backplane structure of the present disclosure, the thickness of the first extension is less than a half of the thickness of the first main body, and the thickness of the second extension is less than a half of the thickness of the second main body.

In the bendable backplane structure of the present disclosure, the first main body includes a first metal layer and a second metal layer which is located on the first metal layer, the first extension is disposed at one side of the first metal layer, which faces toward the second main body, and wherein the second main body includes a third metal layer and a fourth metal layer which is located on the third metal layer, the second extension is disposed at one side of the fourth metal layer, which faces toward the first main body.

In the bendable backplane structure of the present disclosure, the first main body further includes a fifth metal layer which is disposed on the second metal layer, and a third extension is disposed at one side of the fifth metal layer, which faces toward the second main body; wherein the second main body further includes a sixth metal layer which is disposed on the fourth metal layer, and a fourth extension is disposed at one side of the sixth metal layer, which faces toward the first main body; and wherein the third extension overlaps the fourth extension.

A bendable backplane structure, further provided in an embodiment of the present disclosure, comprising:

a first flexible layer, including: a first area, a second area and a third area, which are connected in order; a metal layer, which is disposed on the first flexible layer, including: a first metal section and a second metal section, wherein the first metal section is connected to the first area, the second metal section is connected to the third area, the first metal section includes a first extension, the second metal section includes a second extension, the first extension is disposed corresponding to the second extension in a lamination direction from the first flexible layer toward the metal layer; a second flexible layer, which is disposed on the metal layer, including: a fourth area, a fifth area and a sixth area, which are connected in order, wherein the fourth area and the sixth area are connected to the first metal section and the second metal section respectively, the fourth area, the fifth area and the sixth area are disposed corresponding to the first area, the second area and the third area respectively.

In the bendable backplane structure of the present disclosure, wherein the second area of the first flexible layer and the fifth area of the second flexible layer each have a plurality of through holes.

In the bendable backplane structure of the present disclosure, the second area of the first flexible layer and the fifth area of the second flexible layer each have a wrinkled structure.

In the bendable backplane structure of the present disclosure, the first metal section further includes a first main body which is disposed on the first area, the first extension extends from the first main body to the vicinity of one side of the second metal section, and a thickness of the first extension is less than a thickness of the first main body; wherein the second metal section further includes a second main body which is disposed on the third area, the second extension extends from the second main body to the vicinity of one side of the first metal section, and a thickness of the second extension is less than a thickness of the second main body; and wherein the first extension and the second extension overlap between the fifth area and the second area, and there is a first gap between the first extension and the second extension.

In the bendable backplane structure of the present disclosure, the thickness of the first extension is less than a half of the thickness of the first main body, and the thickness of the second extension is less than a half of the thickness of the second main body.

In the bendable backplane structure of the present disclosure, the first main body includes a first metal layer and a second metal layer which is located on the first metal layer, the first extension is disposed at one side of the first metal layer, which faces toward the second main body, and wherein the second main body includes a third metal layer and a fourth metal layer which is located on the third metal layer, the second extension is disposed at one side of the fourth metal layer, which faces toward the first main body.

In the bendable backplane structure of the present disclosure, the first main body further includes a fifth metal layer which is disposed on the second metal layer, and a third extension is disposed at one side of the fifth metal layer, which faces toward the second main body; wherein the second main body further includes a sixth metal layer which is disposed on the fourth metal layer, and a fourth extension is disposed at one side of the sixth metal layer, which faces toward the first main body; wherein the third extension overlaps the fourth extension.

In the bendable backplane structure of the present disclosure, the first metal layer and the second metal layer are formed as an integrated structure; wherein the third metal layer and the fourth metal layer are formed as an integrated structure.

In the bendable backplane structure of the present disclosure, there is a gap between the first metal layer and the second metal layer, and there is a gap between the third metal layer and the fourth metal layer.

In the bendable backplane structure of the present disclosure, there is a gap between each two adjacent layers of the first metal layer, the second metal layer and the fifth metal layer, and there is a gap between each two adjacent layers of the third metal layer, the fourth metal layer and the sixth metal layer.

In the bendable backplane structure of the present disclosure, the parts of the first metal section and the second metal section, which are located between the second area and the fifth area, are doped with a memory metal.

An OLED display assembly, further provided in an embodiment of the present disclosure, comprising a bendable backplane structure and a flexible display panel which is disposed on the backplane structure, wherein the bendable backplane structure comprises:

a first flexible layer, including: a first area, a second area and a third area, which are connected in order; a metal layer, which is disposed on the first flexible layer, including: a first metal section and a second metal section, wherein the first metal section is connected to the first area, the second metal section is connected to the third area, the first metal section includes a first extension, the second metal section includes a second extension, the first extension is disposed corresponding to the second extension in the lamination direction from the first flexible layer toward the metal layer; a second flexible layer, which is disposed on the metal layer, including: a fourth area, a fifth area and a sixth area, which are connected in order, wherein the fourth area and the sixth area are connected to the first metal section and the second metal section respectively, the fourth area, the fifth area and the sixth area are disposed corresponding to the first area, the second area and the third area respectively; the flexible display panel, including: a bending area, a first displaying area and a second displaying area, wherein the first displaying area, the bending area and the second displaying area are disposed corresponding to the first area, the second area and the third area respectively.

In the OLED display assembly of the present disclosure, the second area of the first flexible layer and the fifth area of the second flexible layer each have a plurality of through holes.

In the OLED display assembly of the present disclosure, the second area of the first flexible layer and the fifth area of the second flexible layer each have a wrinkled structure.

A bendable backplane structure and an OLED display assembly of the present disclosure, comprises a first flexible layer, a metal layer and a second flexible layer which overlap in order.

The first flexible layer includes a first area, a second area and a third area which are connected in order. The metal layer includes a first metal section and a second metal section, wherein the first metal section is connected to the first area, the second metal section is connected to the third area, the first metal section includes a first extension, the second metal section includes a second extension, the first extension is disposed corresponding to the second extension in a lamination direction from the first flexible layer toward the metal layer. The second flexible layer includes a fourth area, a fifth area and a sixth area which are connected in order, wherein the fourth area and the sixth area are connected to the first metal section and the second metal section respectively, the fourth area, the fifth area and the sixth area are disposed corresponding to the first area, the second area and the third area respectively. Through combining the bendability of the first flexible layer and the second flexible layer with the supportability of the metal layer, the bendable backplane structure and the OLED display assembly, according to an embodiment of the present invention, realizes the benefit of being bendable toward each of their front sides and back sides.

BRIEF DESCRIPTION OF THE DRAWINGS

In order to more clearly illustrate the embodiments of the present disclosure, the figures required for describing of the embodiments will be briefly introduced below. It is obvious that the following drawings are merely some embodiments of the present disclosure, a person having ordinary skill in this field can obtain other figures according to these figures under the premise of not paying creative works.

DETAILED DESCRIPTION OF THE EMBODIMENTS

Figure 1:
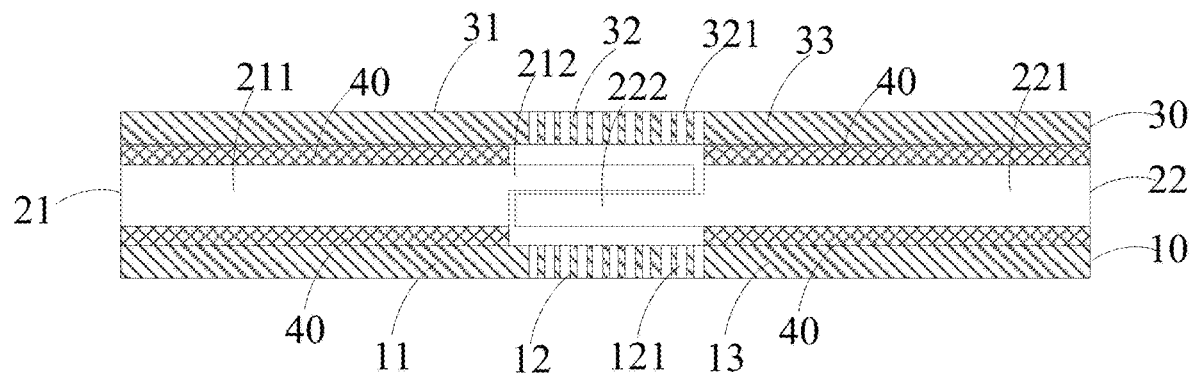
FIG. 1 is a schematic diagram of a bendable backplane structure according to a first embodiment of the present invention.

The embodiments of the present disclosure are described in detail below, and their examples are shown in the accompanying drawings. The same or similar elements or elements having the same or similar functions are denoted by the same or similar reference numerals throughout the descriptions. The following embodiments referring to the accompanying drawings are illustrative and merely used for explaining the present disclosure without being regarded as a limitation to the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or a quantity of features. Thus, features limited by "first" and "second" are intended to indicate or imply including one or more than one these features. In the description of the present disclosure, "a plurality of" relates to two or more than two, unless otherwise specified.

In the description of the present disclosure, unless specified or limited otherwise, it should be noted that, terms "mounted", "interconnected" and "connected" may be understood broadly, such as permanent connection or detachable connection or integral connection, mechanical connection or electronic connection or mutual communication, direct connection or indirect connection via intermediary, inner communication or interaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature, and may also include an embodiment in which an additional feature is formed between the first feature and the second feature so that the first feature does not directly contact the second feature. Furthermore, a first feature "on", "above", or "on top of" a second feature may include an embodiment in which the first feature is right "on", "above", or "on top of" the second feature, and may also include an embodiment in which the first feature is not right "on", "above", or "on top of" the second feature, or just means that the first feature has a sea level elevation greater than the sea level elevation of the second feature. While first feature "beneath", "below", or "on bottom of" a second feature may include an embodiment in which the first feature is right "beneath", "below", or "on bottom of" the second feature, and may also include an embodiment in which the first feature is not right "beneath", "below", or "on bottom of" the second feature, or just means that the first feature has a sea level elevation less than the sea level elevation of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, a person skilled in the art may be aware of applications of other processes and/or other materials.

Please refer to FIG. 1, which is a schematic diagram of a bendable backplane structure used in an OLED display assembly according to a first embodiment of the present invention. The bendable backplane structure includes a first flexible layer 10, a metal layer 20 and a second flexible layer 30.

The first flexible layer 10 includes a first area 11, a second area 12 and a third area 13 which are connected in order, wherein the first area 11 and the third area 13 each correspond to a displaying area of the OLED display assembly, and the second area 12 corresponds to a bending area of the OLED display assembly. Preferably, the first flexible layer is made of flexible material.

The metal layer 20, which is disposed on the first flexible layer 10, includes a first metal section 21 and a second metal section 22. The first metal section 21 is connected to the first area 11, and the second metal section 22 is connected to the third area 13. Preferably, the first metal section 21 adheres to the first area 11 via an adhesive layer 40, and the second metal section 22 adheres to the third area 13 via the adhesive layer 40.

Further, the first metal section 21 includes a first extension 212, and the second metal section 22 includes a second extension 222. The first extension 212 is disposed corresponding to the second extension 222 in a lamination direction from the first flexible layer 10 toward the metal layer 20. In the lamination direction from the first flexible layer 10 toward the metal layer 20, the second area 12, the second extension 222 and the first extension 212 overlap in order.

The second flexible layer 30, which is disposed on the metal layer 20, includes a fourth area 31, a fifth area 32 and a sixth area 33 which are connected in order. The fourth area 31 and the sixth area 33 are connected to the first metal section 21 and the second metal section 22, respectively. Preferably, the fourth area 31, the fifth area 32 and the sixth area 33 of the second flexible layer 30 are disposed corresponding to the first area 11, the second area 12 and the third area 13 of the first flexible layer 10, respectively.

That is to say, the structure and size of the first flexible layer 10 are equal to the structure and size of the second flexible layer 30. In other embodiments, it can be understood that the sizes of the first flexible layer 10 and the second flexible layer 30 can also be different.

In the embodiment, the second area 12 of the first flexible layer 10 has a plurality of through holes 121 along vertical direction, and the fifth area 32 of the second flexible layer 30 has a plurality of through holes 321 along vertical direction, in order to enhance the anti-bending ability.

In the embodiment, the second area 12 of the first flexible layer 10 has a wavy structure 122, and the fifth area 32 of the second flexible layer 30 has a wavy structure 322, in order to enhance the anti-bending ability.

Figure 2:
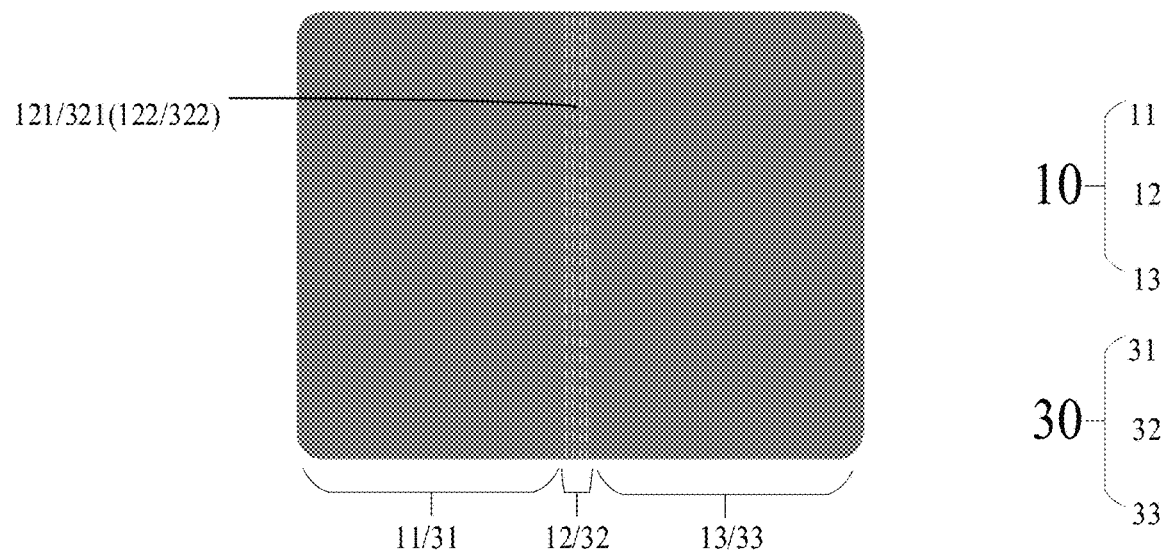
FIG. 2 is a front top view of a first flexible layer or a second flexible layer of a bendable backplane structure according to an embodiment of the present invention.

Please refer to FIG. 2, which is a front top view of a first flexible layer or a second flexible layer of a bendable backplane structure according to an embodiment of the present invention. Combining with FIG. 1, as shown in FIG. 2, by designing the second area 12 of the first flexible layer 10 of the bendable backplane to have the plurality of through holes 121 or the wavy structure 122, and the fifth area 32 of the second flexible layer 30 thereof to have the plurality of through holes 321 or the wavy structure 322, when the bendable backplane is bent, the tension stress to the bendable backplane can be lessened during the bending operation. Thus, when the bendable backplane is bent back to restore its original shape prior to the bending operation, an amount of unintended deformation of the bendable backplane can be reduced.

Specifically, the first metal section 21 includes the first extension 212 and a first main body 211 which is disposed on the first area 11. The first extension 212 is connected vertically to the end face of the first main body 211 and extends from the first main body 211 to the vicinity of one side of the second metal section 22. A thickness of the first extension 212 is less than a thickness of the first main body 211. The second metal section 22 includes the second extension 222 and a second main body 221 which is disposed on the third area 13. The second extension 222 is connected vertically to the end face of the second main body 221 and extends from the second main body 221 to the vicinity of one side of the first metal section 21. A thickness of the second extension 222 is less than a thickness of the second main body 221.

The first extension 212 and the second extension 222 overlap between the fifth area 32 and the second area 12, namely the first extension 212 is disposed corresponding to the second extension 222 in the lamination direction from the first flexible layer 10 toward the metal layer 20, so that the second area 12, the second extension 222, the first extension 212 and the fifth area 32 overlap in order. Preferably, the thickness of the first extension 212 is less than a half of the thickness of the first main body 211, and the thickness of the second extension 222 is less than a half of the thickness of the second main body 221. The bending performance is enhanced while saving material, because the second area 12, the second extension 222, the first extension 212 and the fifth area 32 overlap in the position corresponding to the bending area of the OLED display assembly; the first area 11, the first main body 211 and the fourth area 31 overlap in the position corresponding to the displaying area of the OLED display assembly; the third area 13, the second main body 221 and the sixth area 33 overlap in the position corresponding to the displaying area of the OLED display assembly; there exists a difference between the thickness of the first main body 211 and the first extension 212; and there exists a difference between the thickness of the second main body 221 and the second extension 222. Preferably, the first main body 211 and the first extension 212 are formed as an integrated structure; the second main body 221 and the second extension 222 are formed as an integrated structure.

Further, there is a first gap between the first extension 212 and the second extension 222, namely the first extension 212 is not connected to the second extension 222, so that tensile force that occurs in this position is reduced.

The parts of the first metal section 21 and the second metal section 22, which are located between the second area 12 and the fifth area 32, are doped with a memory metal, such as titanium and the like, for the realization of a bendable function and a recoverable function. Because the parts of the first metal section 21 and the second metal section 22, which are located in the bending area, are doped with the memory metal, the bendable backplane structure can recover to the original (not bended) form, without incurring an unintended deformation.

Figure 3:
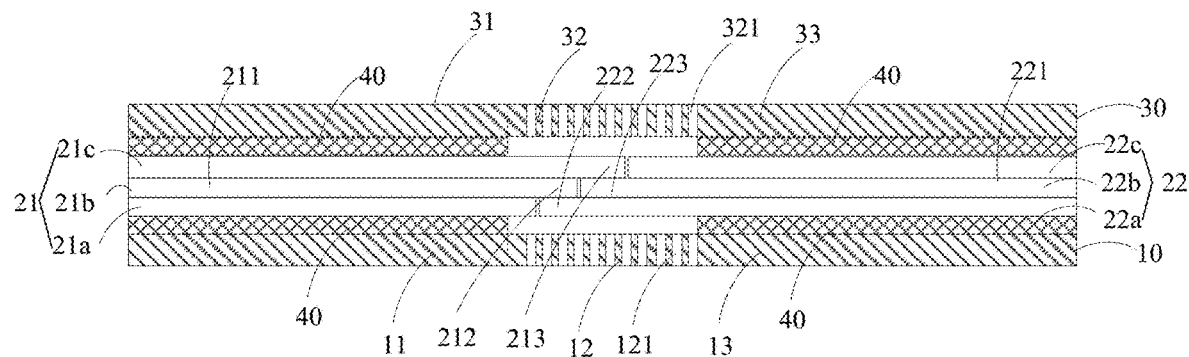
FIG. 3 is a schematic diagram of a bendable backplane structure according to a second embodiment of the present invention.

Please refer to FIG. 3, which is a schematic diagram of a bendable backplane structure used in an OLED display assembly according to a second embodiment of the present invention. The second embodiment is different from the first embodiment in that the first metal section 21 of the second embodiment includes a first metal layer 21a, a second metal layer 21b and a fifth metal layer 21c which overlap in order, and the second metal section 22 of the second embodiment includes a third metal layer 22a, a fourth metal layer 22b and a sixth metal layer 22c which overlap in order.

Specifically, the first main body 211 includes the first metal layer 21a and the second metal layer 21b which is located on the first metal layer 21a. The first extension 212 is disposed at one side of the second metal layer 21b, which faces toward the second main body 221. The second main body 221 includes the third metal layer 22a and the fourth metal layer 22b which is located on the third metal layer 22a. The second extension 222 is disposed at one side of the third metal layer 22a, which faces toward the first main body 211.

Further, in the embodiment, the first main body 211 includes the first metal layer 21a, the second metal layer 21b and the fifth metal layer 21c which are arranged sequentially from bottom to top. The first extension 212 is connected to one side of the second metal layer, which faces toward the second main body 221. A third extension 213 is disposed at one side of the fifth metal layer 21c, which faces toward the second main body 221.

The second main body 221 includes the third metal layer 22a, the fourth metal layer 22b and the sixth metal layer 22c which are arranged sequentially from bottom to top. The second extension 222 is connected to one side of the third metal layer 22a, which faces toward the first main body 211. A fourth extension 223 is disposed at one side of the fourth metal layer 22b, which faces toward the first main body 211.

The third extension 213 overlaps the fourth extension 223, and the first extension 212 overlaps the second extension 222. There is a gap between each two adjacent layers of the first metal layer 21a, the second metal layer 21b and the fifth metal layer 21c, and there is a gap between each two adjacent layers of the third metal layer 22a, the fourth metal layer 22b and the sixth metal layer 22c.

In some embodiments, the first metal layer 21a, the second metal layer 21b and the fifth metal layer 21c are formed as an integrated structure. The third metal layer 22a, the fourth metal layer 22b and the sixth metal layer 22c are formed as an integrated structure.

The thicknesses of metal sub-layers of the first metal section 21 and the second metal section 22, which are located at the same layer, are equal. The ends of metal sub-layers of the first metal section 21 and the second metal section 22, which are located at the same layer, contact each other or are separated by a distance that is less than a threshold. For example, the thickness of the first metal layer 21a of the first metal section 21 is the same as that of the third metal layer 22a of the second metal section 22. In addition, there is a gap between the first metal layer 21a of the first metal section 21 and the third metal layer 22a of the second metal section 22.

Figure 4:
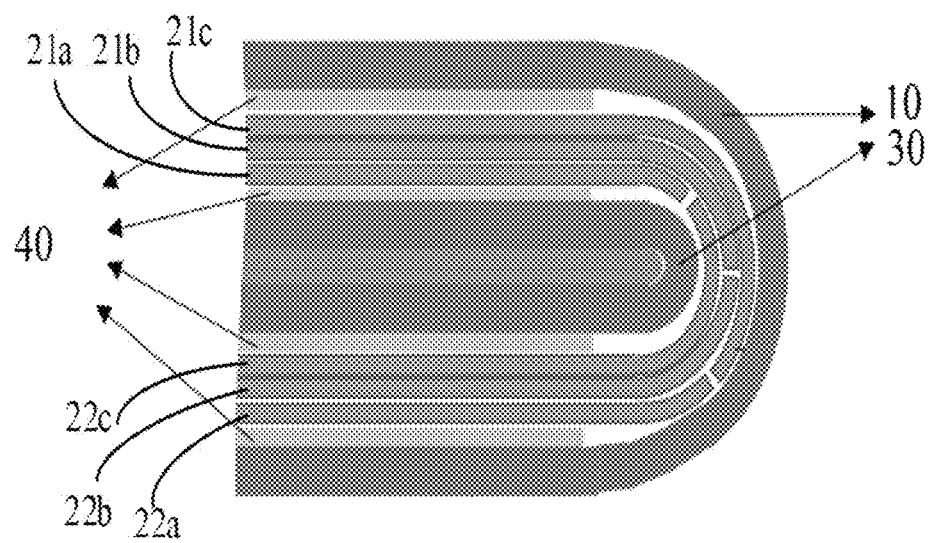
FIG. 4 is a schematic diagram of the bendable backplane structure in a bended status according to the second embodiment of the present invention.

Further, please refer to FIG. 4, which is a schematic diagram of the bendable backplane structure in a bended status according to the second embodiment of the present invention. Combining with FIG. 3, as shown in FIG. 4, when the bendable backplane structure is bended, the following layers are arranged sequentially from top to bottom: the first flexible layer, the fifth metal layer 21c, the second metal layer 21b, the first metal layer 21a, second flexible layer 30, the sixth metal layer 22c, fourth metal layer 22b, third metal layer 22a and the first flexible layer.

The invention further provides an OLED display assembly which comprises the bendable backplane structure disclosed in any of the above embodiments and a flexible displaying layer which is disposed on the bendable backplane structure. The flexible displaying layer is an OLED displaying layer.

Through combining the bendability of the first flexible layer and the second flexible layer with the supportability of the metal layer, the bendable backplane structure and the OLED display assembly, according to an embodiment of the present invention, realizes the benefit of being bendable toward each of their front sides and back sides.

The bendable backplane structure provided in the embodiments of the present disclosure are introduced in detail above. Specific embodiments are used for illustrating principles and implementation manners of the present disclosure. The above descriptions of the embodiments are merely for understanding the present disclosure. At the same time, a person skilled in the art may make modifications to the specific implementation manners and application ranges according to the idea of the present disclosure. In conclusion, the content of the specification shall not be regarded as a limitation to the present disclosure.

What is claimed is:

1. A bendable backplane structure, comprising:
a first flexible layer, including: a first area, a second area and a third area, which are connected in order;
a metal layer, which is disposed on the first flexible layer, including: a first metal section and a second metal section separated from the first metal section, wherein the first metal section is connected to the first area, the second metal section is connected to the third area, the first metal section includes a first extension, the second metal section includes a second extension, the first extension overlaps the second extension in a lamination direction from the first flexible layer toward the metal layer;
a second flexible layer, which is disposed on the metal layer, including: a fourth area, a fifth area and a sixth area, which are connected in order, wherein the fourth area and the sixth area are connected to the first metal section and the second metal section respectively, the fourth area, the fifth area and the sixth area are disposed corresponding to the first area, the second area and the third area respectively;
wherein the first metal section further includes a first main body which is disposed on the first area, the first extension extends from the first main body to the vicinity of one side of the second metal section, and a thickness of the first extension is less than a thickness of the first main body, and wherein the second metal section further includes a second main body which is disposed on the third area, the second extension extends from the second main body to the vicinity of one side of the first metal section, and a thickness of the second extension is less than a thickness of the second main body;
wherein the first extension and the second extension overlap between the fifth area and the second area, and in a flat state of the bendable backplane structure, there is a first gap between the first extension and the second extension, and the first extension is not connected to the second extension; and
wherein parts of the first metal section and the second metal section, which are located between the second area and the fifth area, are doped with a memory metal.

2. The bendable backplane structure of claim 1, wherein the second area of the first flexible layer and the fifth area of the second flexible layer each have a plurality of through holes.

3. The bendable backplane structure of claim 1, wherein the second area of the first flexible layer and the fifth area of the second flexible layer each have a wrinkled structure.

4. The bendable backplane structure of claim 1, wherein the thickness of the first extension is less than a half of the thickness of the first main body, and the thickness of the second extension is less than a half of the thickness of the second main body.

5. The bendable backplane structure of claim 1, wherein the first main body includes a first metal layer and a second metal layer which is located on the first metal layer, the first extension is disposed at one side of the second metal layer, which faces toward the second main body, and wherein the second main body includes a third metal layer and a fourth metal layer which is located on the third metal layer, the second extension is disposed at one side of the third metal layer, which faces toward the first main body.

6. The bendable backplane structure of claim 5, wherein the first main body further includes a fifth metal layer which is disposed on the second metal layer, and a third extension is disposed at one side of the fifth metal layer, which faces toward the second main body;
wherein the second main body further includes a sixth metal layer which is disposed on the fourth metal layer, and a fourth extension is disposed at one side of the fourth metal layer, which faces toward the first main body; and
wherein the third extension overlaps the fourth extension.

7. A bendable backplane structure, comprising:
a first flexible layer, including: a first area, a second area and a third area, which are connected in order;
a metal layer, which is disposed on the first flexible layer, including: a first metal section and a second metal section separated from the first metal section, wherein the first metal section is connected to the first area, the second metal section is connected to the third area, the first metal section includes a first extension, the second metal section includes a second extension, the first extension overlaps the second extension in a lamination direction from the first flexible layer toward the metal layer, and in a flat state of the bendable backplane structure, there is a first gap between the first extension and the second extension, and the first extension is not connected to the second extension;
a second flexible layer, which is disposed on the metal layer, including: a fourth area, a fifth area and a sixth area, which are connected in order, wherein the fourth area and the sixth area are connected to the first metal section and the second metal section respectively, the fourth area, the fifth area and the sixth area are disposed corresponding to the first area, the second area and the third area respectively wherein the first metal section further includes a first main body which is disposed on the first area, the first extension extends from the first main body to the vicinity of one side of the second metal section, and a thickness of the first extension is less than a thickness of the first main body, and wherein the second metal section further includes a second main body which is disposed on the third area, the second extension extends from the second main body to the vicinity of one side of the first metal section, and a thickness of the second extension is less than a thickness of the second main body.

8. The bendable backplane structure of claim 7, wherein the second area of the first flexible layer and the fifth area of the second flexible layer each have a plurality of through holes.

9. The bendable backplane structure of claim 7, wherein the second area of the first flexible layer and the fifth area of the second flexible layer each have a wrinkled structure.

10. The bendable backplane structure of claim 7, wherein the thickness of the first extension is less than a half of the thickness of the first main body, and the thickness of the second extension is less than a half of the thickness of the second main body.

11. The bendable backplane structure of claim 7, wherein the first main body includes a first metal layer and a second metal layer which is located on the first metal layer, the first extension is disposed at one side of the second metal layer, which faces toward the second main body, and wherein the second main body includes a third metal layer and a fourth metal layer which is located on the third metal layer, the second extension is disposed at one side of the third metal layer, which faces toward the first main body.

12. The bendable backplane structure of claim 11, wherein the first main body further includes a fifth metal layer which is disposed on the second metal layer, and a third extension is disposed at one side of the fifth metal layer, which faces toward the second main body;

wherein the second main body further includes a sixth metal layer which is disposed on the fourth metal layer, and a fourth extension is disposed at one side of the fourth metal layer, which faces toward the first main body;

wherein the third extension overlaps the fourth extension.

13. The bendable backplane structure of claim 11, wherein the first metal layer and the second metal layer are formed as an integrated structure; wherein the third metal layer and the fourth metal layer are formed as an integrated structure.

14. The bendable backplane structure of claim 11, wherein there is a gap between the first metal layer and the third metal layer, and there is a gap between the second metal layer and the fourth metal layer.

15. The bendable backplane structure of claim 12, wherein there is a gap between each two adjacent layers of the first metal layer, the second metal layer and the fifth metal layer, and there is a gap between each two adjacent layers of the third metal layer, the fourth metal layer and the sixth metal layer.

16. The bendable backplane structure of claim 7, wherein the parts of the first metal section and the second metal section, which are located between the second area and the fifth area, are doped with a memory metal.

17. An OLED display assembly, comprising a bendable backplane structure and a flexible display panel which is disposed on the backplane structure, wherein the bendable backplane structure comprises:

a first flexible layer, including: a first area, a second area and a third area, which are connected in order;

a metal layer, which is disposed on the first flexible layer, including: a first metal section and a second metal section separated from the first metal section, wherein the first metal section is connected to the first area, the second metal section is connected to the third area, the first metal section includes a first extension, the second metal section includes a second extension, the first extension overlaps to the second extension in the lamination direction from the first flexible layer toward the metal layer, in a flat state of the bendable backplane structure, there is a first gap between the first extension and the second extension, and the first extension is not connected to the second extension;

a second flexible layer, which is disposed on the metal layer, including: a fourth area, a fifth area and a sixth area, which are connected in order, wherein the fourth area and the sixth area are connected to the first metal section and the second metal section respectively, the fourth area, the fifth area and the sixth area are disposed corresponding to the first area, the second area and the third area respectively;

the flexible display panel, including: a bending area, a first displaying area and a second displaying area, wherein the first displaying area, the bending area and the second displaying area are disposed corresponding to the first area, the second area and the third area respectively;

wherein the first metal section further includes a first main body which is disposed on the first area, the first extension extends from the first main body to the vicinity of one side of the second metal section, and a thickness of the first extension is less than a thickness of the first main body, and wherein the second metal section further includes a second main body which is disposed on the third area, the second extension extends from the second main body to the vicinity of one side of the first metal section, and a thickness of the second extension is less than a thickness of the second main body.

18. The OLED display assembly of claim 17, wherein the second area of the first flexible layer and the fifth area of the second flexible layer each have a plurality of through holes.

19. The OLED display assembly of claim 17, wherein the second area of the first flexible layer and the fifth area of the second flexible layer each have a wrinkled structure.

* * * * *